(12) United States Patent
Hague

(10) Patent No.: US 9,997,623 B2
(45) Date of Patent: Jun. 12, 2018

(54) BIDIRECTIONAL POWER SWITCH

(71) Applicant: STMicroelectronics (Tours) SAS, Tours (FR)

(72) Inventor: Yannick Hague, Mettray (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days. days.

(21) Appl. No.: 14/957,803

(22) Filed: Dec. 3, 2015

(65) Prior Publication Data
US 2016/0329417 A1 Nov. 10, 2016

(30) Foreign Application Priority Data

May 5, 2015 (FR) ...................................... 15 54010

(51) Int. Cl.
*H01L 29/66* (2006.01)
*H01L 29/747* (2006.01)
(Continued)

(52) U.S. Cl.
CPC ........ *H01L 29/747* (2013.01); *H01L 25/0652* (2013.01); *H01L 25/072* (2013.01);
(Continued)

(58) Field of Classification Search
CPC ............. H01L 29/747; H01L 29/66386; H01L 27/0817; H01L 2924/13033; H01L 29/74;
(Continued)

(56) References Cited

U.S. PATENT DOCUMENTS 4,025,820 A * 5/1977 Penrod ................... H01H 9/542
361/13
4,071,779 A * 1/1978 Kawanami ....... H03K 17/08124
327/481
(Continued)

FOREIGN PATENT DOCUMENTS

DE    2624044 A1   12/1976
EP    0341730 A2   11/1989
(Continued)

OTHER PUBLICATIONS

Rizk, et al: "A vertical bidirectional bipolar power switch (BipAC) for AC mains applications," 16th European Conference on Power Electronics and Applications (EPE'14—ECCE Europe), 2014 (10 pages).

*Primary Examiner* — Eric Ward
*Assistant Examiner* — Eric Ashbahian
(74) *Attorney, Agent, or Firm* — Crowe & Dunlevy

(57) ABSTRACT

A switch includes three components. Each component includes a stack of three semiconductor regions of alternating conductivity types and a control region in a first of the three semiconductor regions having a type opposite to that of the first semiconductor region. The first semiconductor regions of the first and second components are of a same conductivity type and the first semiconductor regions of the first and third components are of opposite conductivity types. The first semiconductor region of the first component is connected to the control regions of the second and third components. The first semiconductor regions of the second and third components are connected to a first switch terminal, the third semiconductor regions of the first, second, and third components are connected to a second switch terminal, and the control region of the first component is connected to a third switch terminal.

28 Claims, 1 Drawing Sheet

(51) Int. Cl.
*H01L 29/732* (2006.01)
*H01L 25/07* (2006.01)
*H01L 25/065* (2006.01)
*H01L 27/02* (2006.01)
*H01L 27/082* (2006.01)

(52) U.S. Cl.
CPC ........ *H01L 27/0296* (2013.01); *H01L 29/732* (2013.01); *H01L 27/082* (2013.01); *H01L 27/0823* (2013.01); *H01L 2224/06181* (2013.01); *H01L 2224/48137* (2013.01)

(58) Field of Classification Search
CPC .... H01L 29/70–29/7436; H01L 27/082; H01L 27/02; H01L 27/24; H01L 27/24673; H02P 7/05; H02P 7/295; H05B 41/046
See application file for complete search history.

(56) References Cited

U.S. PATENT DOCUMENTS

| | | | | |
|---|---|---|---|---|
| 4,905,119 A * | 2/1990 | Webb | ...................... | H04M 3/18 361/111 |
| 5,889,374 A | 3/1999 | Pezzani | | |
| 5,923,055 A * | 7/1999 | Schlangenotto | .... | H01L 29/0834 257/147 |
| 6,326,648 B1 * | 12/2001 | Jalade | ................ | H01L 27/0623 257/130 |
| 6,897,546 B1 * | 5/2005 | Sakamoto | ........... | H01L 29/0804 257/104 |
| 7,262,442 B2 | 8/2007 | Menard | | |
| 2003/0090271 A1 * | 5/2003 | Hurwicz | ............ | G01R 31/3272 324/424 |
| 2004/0026711 A1 * | 2/2004 | Gimonet | ............... | H01L 29/747 257/119 |
| 2013/0278235 A1 * | 10/2013 | Divan | ...................... | G05F 1/12 323/282 |
| 2013/0320395 A1 * | 12/2013 | Menard | ........... | H01L 29/66386 257/107 |
| 2013/0320909 A1 * | 12/2013 | Pinotti | ...................... | H02P 1/44 318/783 |
| 2015/0048775 A1 * | 2/2015 | Yeh | ........................ | H02P 25/02 318/806 |

FOREIGN PATENT DOCUMENTS

| | | |
|---|---|---|
| EP | 0793344 A1 | 9/1997 |
| EP | 0872891 A1 | 10/1998 |
| EP | 1061650 A1 | 12/2000 |
| JP | S58134471 A | 8/1983 |

* cited by examiner

BIDIRECTIONAL POWER SWITCH

PRIORITY CLAIM

This application claims the priority benefit of French Application for Patent No. 1554010, filed on May 5, 2015, incorporated by reference in its entirety to the maximum extent allowable by law.

TECHNICAL FIELD

The present disclosure relates to a bidirectional power switch.

BACKGROUND

Many types of bidirectional power switches have already been provided. Such switches are for example used in a series connection with a load to be powered between terminals of provision of an alternating current (AC) power supply voltage (for example, the mains voltage), to control the power supplied to the load.

Among known bidirectional power switches, triacs, which are very common and have the advantage of being relatively inexpensive, can be mentioned. A triac is however limited in that its control terminal only enables to control its switching from the off state to the on state, the switching from the on state to the off state occurring naturally when the current flowing through the triac falls below a threshold.

Various solutions based on MOS or bipolar transistors have further been provided to form bidirectional power switches controllable to be turned on and to be turned off. Such switches are however relatively expensive. Further, the control of such switches may require relatively complex circuits.

A bidirectional power switch controllable to be turned on and to be turned off has further recently been provided by the applicant in article Rizk et al., "A vertical bidirectional bipolar power switch (BipAC) for AC mains applications", 16th European Conference on Power Electronics and Applications (EPE'14-ECCE Europe), 2014 (incorporated by reference). The structure and the operation of such a switch will be described in further detail hereafter in relation with FIG. 1.

There is a need for a bidirectional power switch controllable to be turned on and to be turned off, this switch overcoming all or part of the disadvantages of existing switches.

SUMMARY

To achieve this, an embodiment provides a bidirectional power switch comprising first, second, and third components, each comprising: a stack of first, second, and third semiconductor regions of alternated conductivity types; and a semiconductor control region having a conductivity type opposite to that of the first region, arranged in the first region, wherein: the first regions of the first and second components have the same conductivity type and the first regions of the first and third components have opposite conductivity types; the first region of the first component is connected to the control regions of the second and third components; the first regions of the second and third components are connected to a first conduction terminal of the switch; the third regions of the first, second, and third components are connected to a second conduction terminal of the switch; and the control region of the first component is connected to a control terminal of the switch.

According to an embodiment, the first, second, and third regions of the first component respectively are of type P, N, and P.

According to an embodiment, the semiconductor surface of the first component is smaller than that of the second and third components.

According to an embodiment, the first, second, and third components are respectively formed in three different semiconductor chips.

According to an embodiment, the three chips are assembled in a same protection package.

According to an embodiment, the three chips are assembled in three different protection packages.

According to an embodiment, the first and second components on the one hand, and the third component on the other hand, are respectively formed in two different semiconductor chips assembled in a same protection package.

According to an embodiment, the protection package comprises three external connection terminals respectively connected to the first and second conduction terminals and to the control terminal of the switch.

According to an embodiment, the second regions of the first and second components have a doping level in the range from $7 \times 10^{13}$ to $4 \times 10^{14}$ atoms/cm$^3$ and a thickness in the range from 150 to 250 µm, and the second region of the third component has a doping level in the range from $7'10^{13}$ to $4 \times 10^{14}$ atoms/cm$^3$ and a thickness in the range from 150 to 250 µm.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
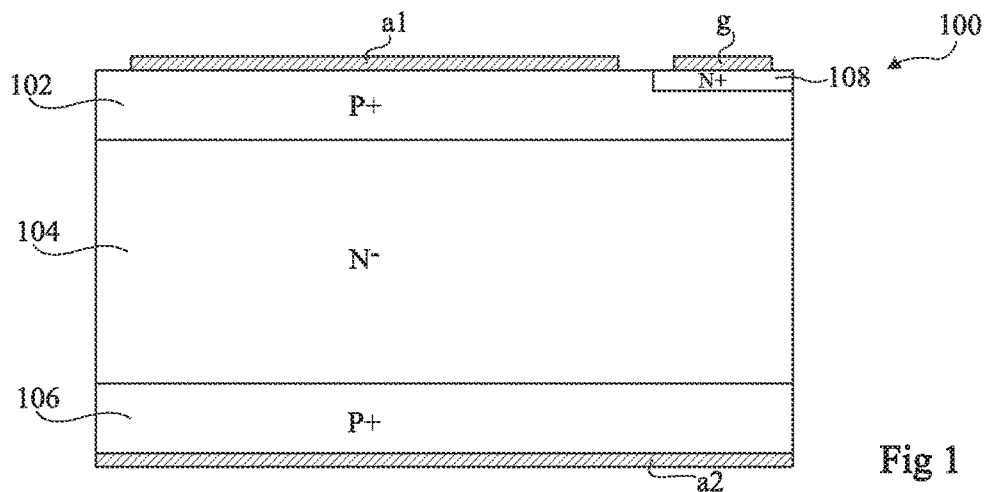
FIG. 1 is a cross-section view schematically illustrating an example of a bidirectional power switch.

The same elements have been designated with the same reference numerals in the different drawings and, further, the various drawings are not to scale. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described components may be oriented differently. Unless otherwise specified, expressions "approximately", "substantially", and "in the order of" mean to within 20%, preferably to within 10%.

In the present disclosure, bidirectional power switch means a switch bidirectional for current and voltage, capable of withstanding relatively high voltages in the off state, for example, voltages greater than 100 V and typically in the order of 600 V or more. A bidirectional power switch controllable to be turned off and to be turned on from a single gate terminal referenced to only one of its main terminals or power conduction terminals is here more specifically considered.

FIG. 1 is a cross-section view schematically illustrating an example of a bidirectional power switch 100 of the type described in the above mentioned article by Rizk, et al.

Switch 100 is a monolithic component comprising a vertical stack of three semiconductor regions or layers 102, 104, and 106 of alternated conductivity types. In this example, lower region 106 is of type P, intermediate region 104, extending from the upper surface of region 106 to the lower surface of region 102, is of type N, and upper region 102 is of type P. Intermediate region 104 is relatively lightly doped with respect to upper and lower regions 102 and 106. In the shown example, intermediate region 104 is thicker than upper and lower regions 102 and 106. As an example, switch 100 is formed from a lightly-doped N-type semiconductor substrate, for example, a silicon substrate, upper and lower regions 102 and 106 being formed by implantation or diffusion of P-type dopant elements respectively from the upper surface and from the lower surface of the substrate. Switch 100 further comprises, in an upper portion of upper region 102, a control region 108 insulated from intermediate region 104 by region 102, having a conductivity type opposite to that of region 102 (that is, of type N in the shown example), and having a doping level higher than that of intermediate region 104. Control region 108 extends vertically from the upper surface of region 102 and down to a depth smaller than that of region 102. In top view, control region 108 occupies a portion only of the surface of the stack of regions 102, 104, and 106. As an example, control region 108 occupies (in top view) less than half and preferably less than one quarter of the surface of the stack of regions 102, 104, and 106. In the shown example, control region 108 is located along one edge of the stack of regions 102, 104, and 106. Region 108 may be formed (in top view) of a plurality of areas, such as a bipolar power transistor having its base and emitter areas generally interdigited. Switch 100 comprises a first main electrode or power conduction electrode a1, in contact with the upper surface of region 102 (at the level of the portion of region 102 which is not occupied by layer 108). Switch 100 further comprises a second main electrode or power conduction electrode a2, in contact with the lower surface of region 106. Switch 100 further comprises a control electrode g in contact with the upper surface of control region 108.

The turning-on (closing) of switch 100 of FIG. 1 is obtained by applying a negative current on its control terminal g referenced to terminal a1, which causes the forward biasing of the PN junction formed between regions 102 and 108. Electrons of control region 108 are then injected into region 102. Part of these electrons reaches region 104, forming a base current causing the turning-on of the vertical PNP bipolar transistor formed by regions 102, 104, and 106. More particularly, if the voltage between main terminals a1 and a2 of the switch is positive (Va2−Va1>0, Va1 and Va2 respectively designating the potential of terminal a1 and the potential of terminal a2), holes are injected from region 106 into region 104. Part of these holes is recombined in region 104, the rest being collected by region 102. If the voltage between terminals a1 and a2 is negative (Va2−Va1<0), holes are injected from region 102 into region 104. Part of these holes is recombined in region 104, the rest being collected by region 106.

The current flowing through the PNP transistor formed by regions 102, 104, and 106 is a function of the control current applied to control terminal g.

The turning-off of switch 100 is obtained by interrupting the control current applied to terminal g, for example, by setting terminal g to the same potential as terminal a1 or by opening the current loop.

As indicated in the above-mentioned article by Rizk, et al., the gain of the structure of FIG. 1, that is, the ratio of the current flowing between main electrodes a1 and a2 of the switch in the on state to the control current applied on control electrode g of the switch is all the higher as the thickness of base region 104 is small. However, the smaller the thickness of base region 104, the lower the breakdown voltage of the switch. For a given thickness of base region 104, the gain may be increased by increasing the surface area of the active portion of the switch (that is, the portion of the PNP stack which is not occupied by control region 108). This however causes a significant increase of the switch cost. Further, such a gain increase is by construction limited by the charge carrier transport factor in region 104, which has been estimated to approximately 0.85 for a 600-V breakdown voltage, which corresponds to a theoretical maximum current gain in the order of 5.6 for usual carrier lifetimes in high-injection mode.

As an example, with a structure of the type described in relation with FIG. 1, sized (doping levels and thicknesses of layers 102, 104, and 106, in particular) to withstand a 600-V voltage and having a semiconductor surface area in the order of 6 mm$^2$, and for a control current $i_g$ in the order of 40 mA, a gain approximately equal to 4.5 has been measured for a voltage $V_{a2a1}$ (=Va2−Va1) between conduction terminals a1 and a2 in the order of 1 V, and a gain approximately equal to 2.8 has been measured for a voltage $V_{a2a1}$ in the order of −1 V.

It would be desirable to improve the tradeoff between the gain, the breakdown voltage, and the semiconductor surface area of the switch. It should in particular be noted that a high gain enables to limit the intensity of the current to be applied to the control terminal of the switch to turn it on.

Figure 2:
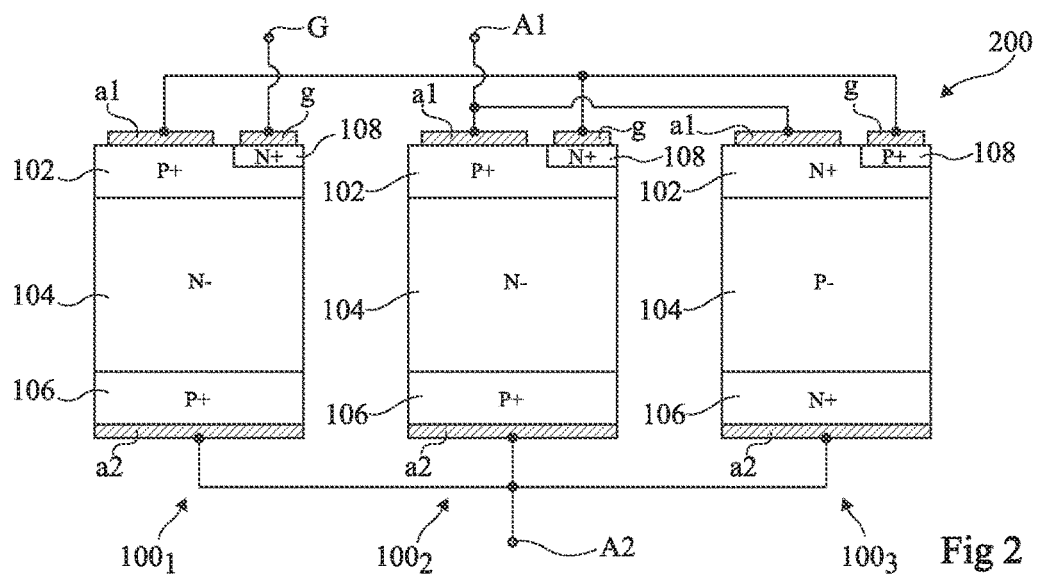
FIG. 2 is a simplified view of an embodiment of a bidirectional power switch.

FIG. 2 is a simplified view of an embodiment of a bidirectional power switch 200.

Switch 200 of FIG. 2 comprises three components $100_1$, $100_2$, and $100_3$ of the type described in relation with FIG. 1. In the shown example, components $100_1$ and $100_2$ are of the same conductivity type as component 100 of FIG. 1, that is, their regions 102, 104, 106, and 108 are respectively of type P, of type N, of type P, and of type N. Component $100_3$ is of the opposite conductivity type, that is, its regions 102, 104, 106, and 108 respectively are of type N, of type P, of type N, and of type P. Main electrode a1 of component $100_1$ is connected to control electrode g of component $100_2$ and to control electrode g of component $100_3$, for example, by a conductive track or wire. Control electrode g of component $100_1$ is connected to a control terminal or electrode G of switch 200. Main electrode a1 of component $100_2$ and main electrode a1 of component $100_3$ are connected to a first terminal or main electrode A1 of switch 200. Main electrode a2 of component $100_1$, main electrode a2 of component $100_2$, and main electrode a2 of component $100_3$ are connected to a second terminal or main electrode A2 of switch 200.

Switch 200 of FIG. 2 may be controlled identically or similarly to switch 100 of FIG. 1, by replacing terminals a1, a2, and g of FIG. 1 with terminals A1, A2, and G of FIG. 2.

In particular, the turning-on (closing) of switch 200 of FIG. 2 can be obtained by applying a negative current on its control terminal G, with reference to its terminal A1, which causes the forward biasing of the PN junction formed between 102 and 108 of component $100_1$.

If voltage $V_{A2A1}$ between main conduction terminals A1 and A2 of the switch is positive, the PN junction formed between regions 102 and 108 of component $100_2$ is forward biased, and voltage $V_{A2A1}$ is transferred between terminals a1 and a2 of component $100_1$ via this junction (to within the voltage drop of the PN junction). Under the effect of the negative control current applied to its terminal g, component $100_1$ starts conducting identically or similarly to what has been described in relation with FIG. 1. A current then flows between electrodes A1 and A2 of switch 200, this current flowing through the PN junction formed between regions 102 and 108 of component $100_2$, and through the vertical PNP transistor formed by regions 102, 104, and 106 of component $100_1$. This current forms for component $100_2$ a control current ensuring its turning-on.

If voltage $V_{A2A1}$ between main conduction terminals A1 and A2 of the switch is negative, the PN junction formed between regions 108 and 102 of component $100_3$ is forward biased, and voltage $V_{A2A1}$ is transferred between terminals a1 and a2 of component $100_1$ via this junction (to within the voltage drop of the PN junction). Under the effect of the negative control current applied to its terminal g, component $100_1$ starts conducting identically or similarly to what has been described in relation with FIG. 1. A current then flows between electrodes A2 and A1 of switch 200, this current flowing through the vertical PNP transistor formed by regions 102, 104, and 106 of component $100_1$, and through the PN junction formed between region 108 and region 102 of component $100_3$. This current forms for component $100_3$ a control current ensuring its turning-on.

Thus, in switch 200 of FIG. 2, the current mainly flows through component $100_2$ when voltage $V_{A2A1}$ is positive, and through component $100_3$ when voltage $V_{A2A1}$ is negative. Component $100_1$ enables to amplify the control current of components $100_2$ and $100_3$. Thus, the gain of switch 200 of FIG. 2 is substantially equal to the gain of component $100_1$ multiplied by the gain of component $100_2$ for a positive voltage $V_{A2A1}$, and to the gain of component $100_1$ multiplied by the gain of component $100_3$ for a negative voltage $V_{A2A1}$.

It should be noted that, in practice, component $100_1$ may have a smaller surface area than components $100_2$ and $100_3$. The described embodiments are however not limited to this specific case. More generally, whatever the dimensions of components $100_1$, $100_2$, and $100_3$, the current flowing between terminals A1 and A2 of switch 200 in the on state naturally distributes between components $100_1$ and $100_2$ or between components $100_1$ and $100_3$ according to the direction of the halfwave, by proportions depending on the dimensions of the components.

An advantage of the embodiment described in relation with FIG. 2 is that, for a given breakdown voltage (defined, in particular, by the thickness of regions 104 of components $100_1$, $100_2$, and $100_3$), it enables, at the cost of a reasonable increase of the total semiconductor surface area, to significantly increase the gain with respect to a switch of the type described in relation with FIG. 1, and in particular to increase the gain beyond the theoretical limit imposed by the transport factor in region 104.

As an example, with a structure of the type described in relation with FIG. 2, sized to withstand a 600-V voltage and having a semiconductor surface area in the order of 18 mm$^2$, and for a control current $I_G$ in the order of 40 mA, a gain approximately equal to 12 has been measured for a voltage $V_{A2A1}$ between conduction terminals A1 and A2 in the order of 1 V, and a gain approximately equal to 11 has been measured for a voltage $V_{A2A1}$ in the order of −1 V.

Components $100_1$, $100_2$, and $100_3$ of switch 200 of FIG. 2 are for example three discrete semiconductor components assembled in a same protection package only comprising three external contact terminals, terminals A1, A2, and G. The described embodiments are however not limited to this specific case.

Figure 3:
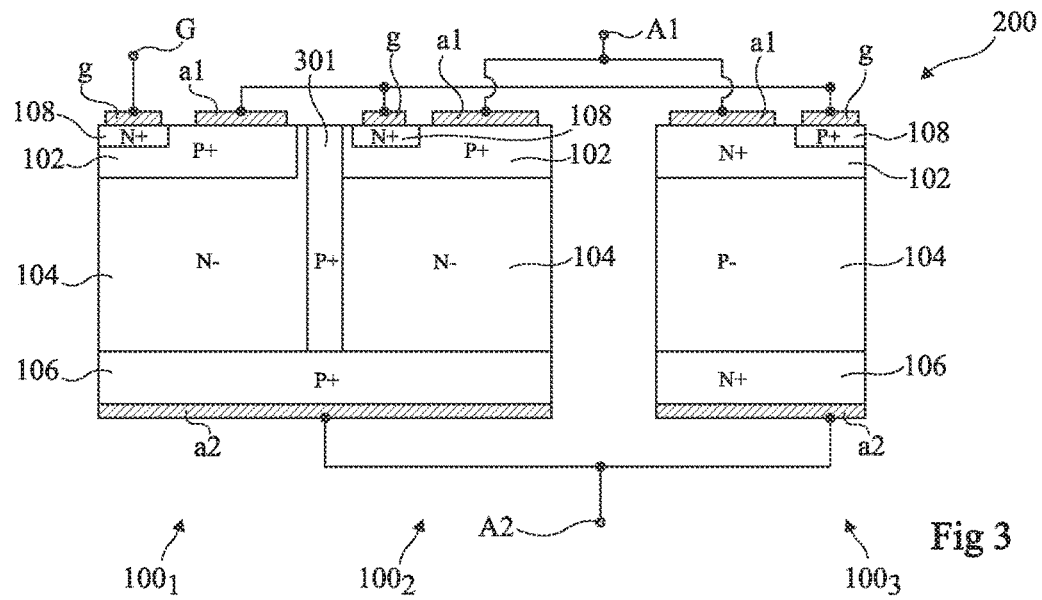
FIG. 3 is a simplified top view of an alternative embodiment of the bidirectional power switch of FIG. 2.

FIG. 3 is a cross-section view schematically illustrating an alternative embodiment of switch 200 of FIG. 2, where components $100_1$ and $100_2$ having the same conductivity type are integrated in a same semiconductor chip, component $100_3$ being a discrete component formed in a separate semiconductor chip. The chip comprising components $100_1$ and $100_2$ and the chip comprising $100_3$ may be assembled in a same protection package only comprising three external contact terminals, terminals A1, A2, and G.

In the example of FIG. 3, a P-type doped vertical insulating wall 301 separates component $100_1$ from component $100_2$. Insulating wall 301 is for example connected to the lower P-type regions 106 of components $100_1$ and $100_2$. As an example, the doping level of insulating wall 301 is the same as that of the lower P-type regions 106 of components $100_1$ and $100_2$. The upper P-type regions 102 of components $100_1$ and $100_2$ are laterally insulated from wall 301 by portions of N-type substrate 104.

As an example, in the embodiments of FIGS. 2 and 3, the N-type regions 104 of components $100_1$ and $100_2$ may have a doping level in the range from $7\times10^{13}$ to $4\times10^{14}$ atoms/cm$^3$, the P-type region 104 of component $100_3$ may have a doping level in the range from $7\times10^{13}$ to $4\times10^{14}$ atoms/cm$^3$, the P-type regions 102 of components $100_1$ and $100_2$ may have a doping level in the range from $1*10^{16}$ to $1*10^{18}$ atoms/cm$^3$, the N-type region 102 of component $100_3$ may have a doping level in the range from $1\times10^{16}$ to $1\times10^{18}$ atoms/cm$^3$, the P-type regions 106 of components $100_1$ and $100_2$ may have a doping level in the range from $1\times10^{16}$ to $1\times10^{18}$ atoms/cm$^3$, the N-type region 106 of component $100_3$ may have a doping level in the range from $1\times10^{16}$ to $1\times10^{18}$ atoms/cm$^3$, the N-type regions 108 of components $100_1$ and $100_2$ may have a doping level in the range from $1\times10^{19}$ to $1\times10^{20}$ atoms/cm$^3$, and the P-type region 108 of component $100_3$ may have a doping level in the range from $1\times10^{19}$ to $1\times10^{20}$ atoms/cm$^3$. Further, the N-type regions 104 of components $100_1$ and $100_2$ may have a thickness in the range from 150 to 250 μm, and the P-type region 104 of component $100_3$ may have a thickness in the range from 150 to 250 μm.

Specific embodiments have been described. Various alterations, modifications, and improvements will occur to those skilled in the art. In particular, the described embodiments are not limited to the examples of numerical values mentioned in the present description.

Further, an operation similar to what has been described hereabove may be obtained by inverting the conductivity types of regions 102, 104, 106, and 108 of the three components $100_1$, $100_2$, and $100_3$.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A bidirectional power switch comprising a first component, a second component, and a third component, wherein each component comprises:

a stack of a first semiconductor region, a second semiconductor region, and a third semiconductor region, the first through third semiconductor regions having alternating conductivity types; and a semiconductor control region having a conductivity type opposite to a conductivity type of the first region and arranged in the first region, wherein:
the first semiconductor regions of the first and second components have a same conductivity type and the first semiconductor regions of the first and third components have opposite conductivity types;
the first semiconductor region of the first component is connected to the semiconductor control regions of the second and third components;
the first semiconductor regions of the second and third components are connected to a first conduction terminal of the switch;
the third semiconductor regions of the first, second, and third components are connected to a second conduction terminal of the switch; and
the semiconductor control region of the first component is connected to a control terminal of the switch;
wherein there is a direct electrical connection of the first semiconductor region of the first component to the semiconductor control regions of the second and third components;
wherein there is a direct electrical connection of the first semiconductor regions of the second and third components to the first conduction terminal of the switch; and
wherein there is a direct electrical connection of the third semiconductor regions of the first, second, and third components to the second conduction terminal of the switch.

2. The switch of claim 1, wherein the first, second, and third semiconductor regions of the first component respectively are of type P, N, and P.

3. The switch of claim 1, wherein a semiconductor surface of the first component is smaller than a semiconductor surface for each of the second and third components.

4. The switch of claim 1, wherein the first, second, and third components are respectively formed in three different semiconductor chips.

5. The switch of claim 4, wherein the three different semiconductor chips are assembled in a same protection package.

6. The switch of claim 5, wherein the protection package comprises three external connection terminals respectively connected to the first and second conduction terminals and to the control terminal of the switch.

7. The switch of claim 4, wherein the three different semiconductor chips are assembled in three different protection packages.

8. The switch of claim 1, wherein the first and second components are formed on a first semiconductor chip, and wherein the third component is formed in a second semiconductor chip, and wherein the first and second semiconductor chips are assembled in a same protection package.

9. The switch of claim 8, wherein the protection package comprises three external connection terminals respectively connected to the first and second conduction terminals and to the control terminal of the switch.

10. The switch of claim 1, wherein the second semiconductor regions of the first and second components have a doping level in the range from $7 \times 10^{13}$ to $4 \times 10^{14}$ atoms/cm$^3$ and a thickness in the range from 150 to 250 µm, and wherein the second semiconductor region of the third component has a doping level in the range from $7 \times 10^{13}$ to $4 \times 10^{14}$ atoms/cm$^3$ and has a thickness in the range from 150 to 250 µm.

11. A power switch, comprising:
a first stack of three semiconductor regions having alternating conductivity types and including a first semiconductor control region arranged in a first one of said three semiconductor regions and having a conductivity type opposite to a conductivity type of the first one of said three semiconductor regions,
a second stack of three semiconductor regions having alternating conductivity types and including a second semiconductor control region arranged in a first one of said three semiconductor regions and having a conductivity type opposite to a conductivity type of the first one of said three semiconductor regions,
wherein:
a gate terminal of the power switch is connected to the first semiconductor control region;
the first one of said three semiconductor regions in the first stack is connected to the second semiconductor control region;
a first conduction terminal of the power switch is connected to the first one of said three semiconductor regions in the second stack; and
a second conduction terminal of the power switch is connected to third ones of said three semiconductor regions in both the first and second stack;
wherein there is a direct electrical connection of the first one of said three semiconductor regions in the first stack to the second semiconductor control region;
wherein there is direct electrical connection of the first conduction terminal of the power switch to the first one of said three semiconductor regions in the second stack; and
wherein there is a direct electrical connection of the second conduction terminal of the power switch to third ones of said three semiconductor regions in both the first and second stack.

12. The power switch of claim 11, wherein said first and second stack are formed on separate dies which are assembled in a same protection package.

13. The power switch of claim 11, wherein said first and second stack are formed on a common die that is assembled in a protection package.

14. The power switch of claim 11, wherein the alternating conductivity types in the first and second stacks are the same.

15. The power switch of claim 11, wherein the alternating conductivity types in the first and second stacks are opposite.

16. The power switch of claim 11, further comprising:
a third stack of three semiconductor regions having alternating conductivity types and including a third semiconductor control region arranged in a first one of said three semiconductor regions and having a conductivity type opposite to a conductivity type of the first one of said three semiconductor regions,
wherein:
the first one of said three semiconductor regions in the first stack is further directly connected to the third semiconductor control region;
the first conduction terminal of the power switch is further directly connected to the first one of said three semiconductor regions in the third stack; and
the second conduction terminal of the power switch is further directly connected to a third one of said three semiconductor regions in the third stack.

17. The power switch of claim 16, wherein the alternating conductivity types in the first and second stacks are the same and the alternating conductivity types in the third stack are opposite the alternating conductivity types in the first and second stacks.

18. The power switch of claim 17, wherein said first and second stack are formed on a common die, the third stack is formed on another die, and the common die and another die are assembled in a protection package.

19. A power switch, comprising:
a first vertical bidirectional bipolar power switch having a first main electrode, a second main electrode and a control electrode;
a second vertical bidirectional bipolar power switch having a first main electrode, a second main electrode and a control electrode;
a third vertical bidirectional bipolar power switch having a first main electrode, a second main electrode and a control electrode;
a first direct electrical connection of the first main electrode of the first vertical bidirectional bipolar switch to the control electrodes of both the second and third vertical bidirectional bipolar switches;
a second direct electrical connection of a first terminal of the power switch to the first main electrodes of the second and third vertical bidirectional bipolar switches; and
a third direct electrical connection of a second terminal of the power switch to the second main electrodes of the first, second and third vertical bidirectional bipolar switches.

20. The power switch of claim 19, wherein the first and second vertical bidirectional bipolar power switches are PNP-type devices and the third vertical bidirectional bipolar power switch is an NPN-type device.

21. The power switch of claim 19, wherein the first and second vertical bidirectional bipolar power switches are integrated on a common semiconductor substrate, and wherein the third vertical bidirectional bipolar power switch is integrated on a separate semiconductor substrate.

22. The power switch of claim 21, wherein the semiconductor substrates are assembled in a same protection package.

23. The power switch of claim 19, wherein the first, second and third vertical bidirectional bipolar power switches are each integrated on a separate semiconductor substrate.

24. The power switch of claim 23, wherein the semiconductor substrates for the first, second and third vertical bidirectional bipolar power switches are assembled in a same protection package.

25. A power switch, comprising:
a first PNP vertical bidirectional bipolar power switch having a first P electrode, a second P electrode and a control electrode;
a second PNP vertical bidirectional bipolar power switch having a first P electrode, a second P electrode and a control electrode;
an NPN vertical bidirectional bipolar power switch having a first N electrode, a second N electrode and a control electrode;
a first direct electrical connection of the first P electrode of the first PNP vertical bidirectional bipolar switch to both the control electrode of the second PNP vertical bidirectional bipolar switch and the control electrode of the NPN vertical bidirectional bipolar power switch;
a second direct electrical connection of a first terminal of the power switch to both the first P electrode of the second PNP vertical bidirectional bipolar switch and the first N electrode of the NPN vertical bidirectional bipolar switch; and
a third direct electrical connection of a second terminal of the power switch to each of the second P electrodes of the first and second PNP vertical bidirectional bipolar switches and the second N electrode of the NPN vertical bidirectional bipolar switch.

26. The power switch of claim 25, wherein the first and second PNP vertical bidirectional bipolar power switches are integrated on a first semiconductor substrate, and wherein the NPN vertical bidirectional bipolar power switch is integrated on a second semiconductor substrate separate from said first semiconductor substrate.

27. A power switch, comprising:
a first NPN vertical bidirectional bipolar power switch having a first N electrode, a second N electrode and a control electrode;
a second NPN vertical bidirectional bipolar power switch having a first N electrode, a second N electrode and a control electrode;
an PNP vertical bidirectional bipolar power switch having a first P electrode, a second P electrode and a control electrode;
a first direct electrical connection of the first N electrode of the first NPN vertical bidirectional bipolar switch to both the control electrode of the second NPN vertical bidirectional bipolar switch and the control electrode of the PNP vertical bidirectional bipolar power switch;
a second direct electrical connection of a first terminal of the power switch to both the first N electrode of the second NPN vertical bidirectional bipolar switch and the first P electrode of the PNP vertical bidirectional bipolar switch; and
a third direct electrical connection of a second terminal of the power switch to each of the second N electrodes of the first and second NPN vertical bidirectional bipolar switches and the second P electrode of the PNP vertical bidirectional bipolar switch.

28. The power switch of claim 27, wherein the first and second NPN vertical bidirectional bipolar power switches are integrated on a first semiconductor substrate, and wherein the PNP vertical bidirectional bipolar power switch is integrated on a second semiconductor substrate separate from said first semiconductor substrate.

* * * * *

UNITED STATES PATENT AND TRADEMARK OFFICE
CERTIFICATE OF CORRECTION

PATENT NO. : 9,997,623 B2
APPLICATION NO. : 14/957803
DATED : June 12, 2018
INVENTOR(S) : Yannick Hague Page 1 of 1

It is certified that error appears in the above-identified patent and that said Letters Patent is hereby corrected as shown below:

In the Specification

At Column 2, Line number 29, please replace the term [[7'10$^{13}$]] with --7×10$^{13}$--.

Signed and Sealed this
Eighteenth Day of September, 2018

Andrei Iancu
*Director of the United States Patent and Trademark Office*